US012349302B2

(12) United States Patent
Maggi et al.

(10) Patent No.: US 12,349,302 B2
(45) Date of Patent: Jul. 1, 2025

(54) ELECTRONIC MODULE CARRYING A PLURALITY OF ELECTRONIC DEVICES

(71) Applicant: STMICROELECTRONICS S.r.l., Agrate Brianza (IT)

(72) Inventors: Luca Maggi, Garlate (IT); Marco Del Sarto, Monza (IT); Alex Gritti, Vimercate (IT); Amedeo Maierna, Albuzzano (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 197 days.

(21) Appl. No.: 18/056,081

(22) Filed: Nov. 16, 2022

(65) Prior Publication Data

US 2023/0171911 A1    Jun. 1, 2023

(30) Foreign Application Priority Data

Nov. 26, 2021   (IT) .................. 102021000030020

(51) Int. Cl.
| | | |
|---|---|---|
| *H05K 7/14* | (2006.01) | |
| *H01L 23/13* | (2006.01) | |
| *H01L 23/552* | (2006.01) | |
| *H01L 23/66* | (2006.01) | |
| *H01Q 1/36* | (2006.01) | |

(52) U.S. Cl.
CPC .......... *H05K 7/1427* (2013.01); *H01L 23/13* (2013.01); *H01L 23/552* (2013.01); *H01L 23/66* (2013.01); *H01Q 1/36* (2013.01); *H01L 2223/6677* (2013.01); *H05K 2201/047* (2013.01); *H05K 2201/10098* (2013.01); *H05K 2201/2018* (2013.01)

(58) Field of Classification Search
CPC .......... H05K 7/1427; H05K 2201/047; H05K 2201/10098; H05K 2201/2018; H01L 23/13; H01L 23/552; H01L 23/66; H01L 2223/6677; H01Q 1/36
See application file for complete search history.

(56) References Cited

U.S. PATENT DOCUMENTS

| | | | | |
|---|---|---|---|---|
| 4,801,992 A | * | 1/1989 | Golubic | .............. H01L 23/5385 |
| | | | | 361/728 |
| 4,990,948 A | * | 2/1991 | Sasaki | .................... G03B 17/02 |
| | | | | 361/749 |
| 6,137,691 A | * | 10/2000 | Jang | ....................... H05K 1/189 |
| | | | | 174/250 |
| 6,580,608 B1 | * | 6/2003 | Searls | ................. H01L 23/3675 |
| | | | | 257/713 |

(Continued)

FOREIGN PATENT DOCUMENTS

| | | | |
|---|---|---|---|
| CN | 109470886 A | 3/2019 | |
| DE | 102013216493 A1 | * 2/2015 | ........... H05K 3/4691 |

*Primary Examiner* — Rockshana D Chowdhury
*Assistant Examiner* — Martin Antonio Asmat Uceda
(74) *Attorney, Agent, or Firm* — Seed IP Law Group LLP

(57) ABSTRACT

The electronic module has a three-dimensional frame, a printed circuit board and a plurality of electronic devices. The printed circuit board is fixed to the three-dimensional frame and has a plurality of support portions which extend transversely to each other in space. The electronic devices are fixed to the printed circuit board and are operatively coupled to each other. The electronic devices are arranged on at least one support portion of the printed circuit board.

20 Claims, 8 Drawing Sheets

(56) References Cited

U.S. PATENT DOCUMENTS

| | | | | |
|---|---|---|---|---|
| 7,639,513 B2* | 12/2009 | Otsuki | ............... | H01L 23/5387 |
| | | | | 361/818 |
| 8,368,154 B2* | 2/2013 | Trusov | ................. | G01C 21/166 |
| | | | | 257/417 |
| 8,971,048 B2* | 3/2015 | Lucas | .................... | F42C 15/40 |
| | | | | 361/748 |
| 9,093,360 B2* | 7/2015 | Bolognia | ........... | G06V 40/1306 |
| 11,335,652 B2* | 5/2022 | Vincent | ............... | H01L 23/5389 |
| 11,355,833 B2* | 6/2022 | Hiramatsu | ........... | A61B 5/6817 |
| 11,412,322 B2* | 8/2022 | Lee | ......................... | H04R 5/02 |
| 2014/0160692 A1* | 6/2014 | Lau | ........................ | H05K 3/366 |
| | | | | 361/736 |
| 2014/0293531 A1* | 10/2014 | Brooks | ................. | H05K 1/148 |
| | | | | 361/679.02 |
| 2015/0085903 A1* | 3/2015 | Gundel | ................ | H05K 5/0026 |
| | | | | 375/219 |
| 2019/0067151 A1* | 2/2019 | Chen | ................... | H01L 23/5387 |
| 2021/0035927 A1 | 2/2021 | Vincent et al. | | |
| 2022/0322532 A1* | 10/2022 | Huener | ................... | H05K 3/36 |

\* cited by examiner

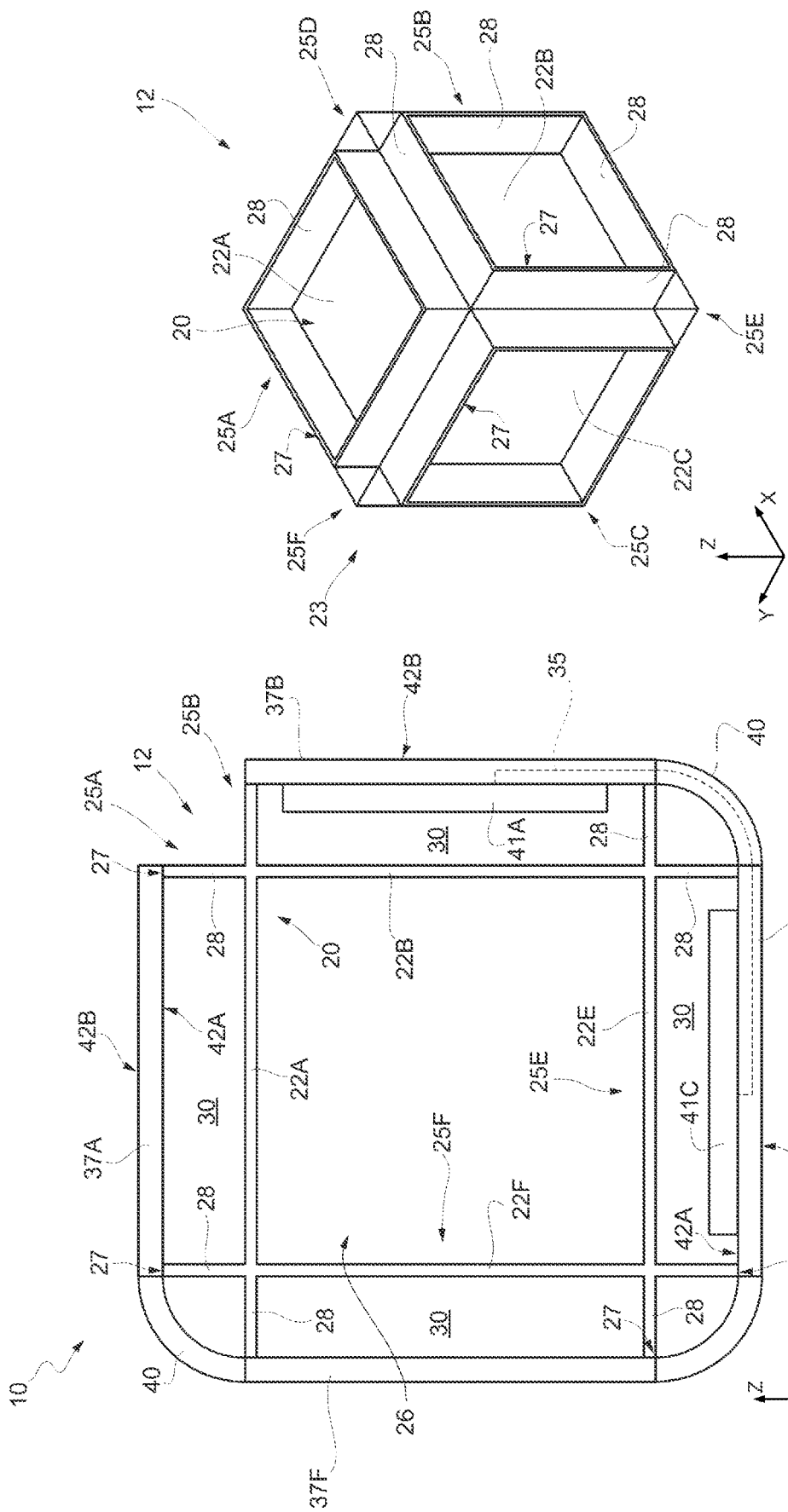

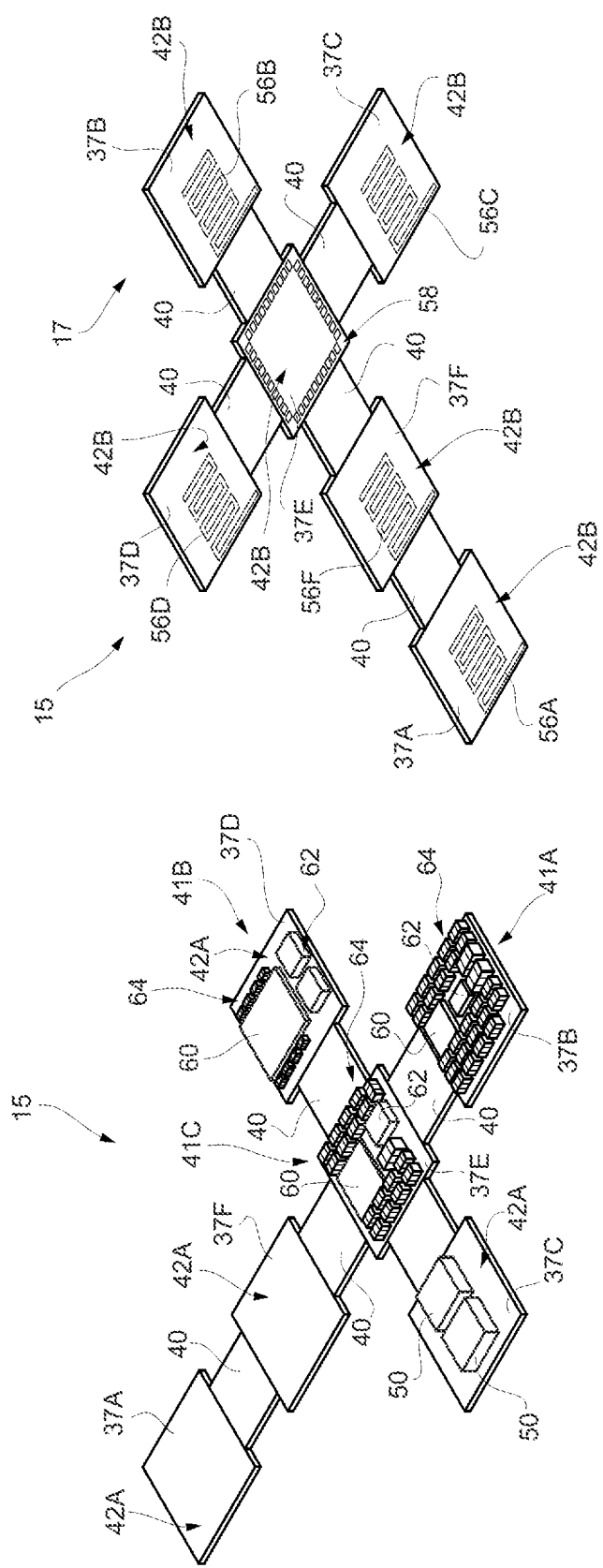

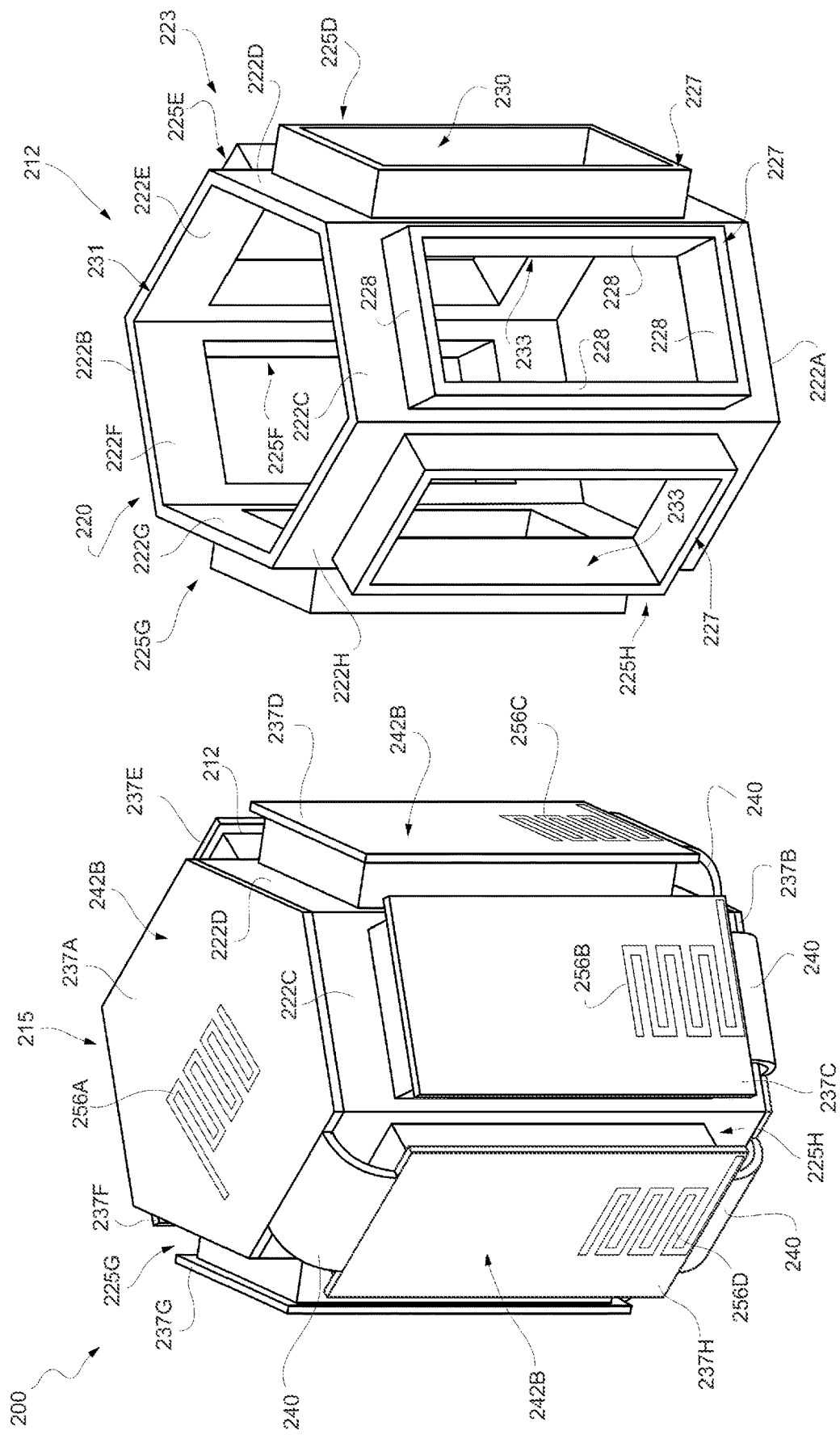

ELECTRONIC MODULE CARRYING A PLURALITY OF ELECTRONIC DEVICES

BACKGROUND

Technical Field

The present disclosure relates to an electronic module carrying a plurality of electronic devices.

Description of the Related Art

Electronic modules, also known as Systems-in-a-Package (SiP), are known, comprising one or more integrated circuits, sensors and passive elements arranged in a same package and mutually coupled so to perform complex functions.

For instance, these electronic modules may be incorporated in mobile devices such as smartphones, media players, wearable devices, etc., or may be stand-alone devices, such as IoT devices for biomedical, industrial, automotive, consumer applications, etc.

Electronic modules may be used to form the nodes of a network of electronic modules wirelessly coupled with each other, wherein each electronic module is configured to detect one or more physical quantities and generate detection data, process the detection data and send the processed data to the other electronic modules of the network.

To this end, each electronic module comprises, in a same package, one or more sensors, for example inertial, temperature, pressure sensors etc., for example of MEMS-type, configured to generate the detection data; one or more integrated circuits, configured to process the detection data, for example through complex artificial intelligence algorithms; and one or more antennas, for example radio frequency antennas, configured to send processed data to other electronic modules of the network of electronic modules.

As known, the antennas of these electronic modules may have high area occupation, for example of the order of a few square millimeters for antennas operating at a frequency of about 2 GHz.

The known electronic modules have a substantially planar package, i.e., the electronic devices of the electronic module are all carried by a single mounting surface which is planar or substantially planar.

As a result, known electronic modules have a very high footprint or area occupation.

Known approaches for the package of electronic devices use a double-sided Surface Mount Technology (SMT), in order to reduce the footprint of the package of the electronic module.

However, the presence of the antennas entails that the footprint of the electronic module is not sufficiently reduced, in specific applications.

Furthermore, the integrated circuits and the antennas of known electronic modules may be subject to high mutual electromagnetic interference, particularly if the antennas are configured to operate at different frequencies.

BRIEF SUMMARY

The present disclosure is directed to at least one embodiment of an electronic module to overcome the disadvantages of the prior art.

For example, in the at least one embodiment, the electronic module includes a three-dimensional frame. A printed circuit board is fixed to the three-dimensional frame, and the printed circuit board includes a plurality of support portions that extend transversely to each other in space. A plurality of electronic devices are fixed to the printed circuit board, the plurality of electronic devices are operatively coupled to each other, and wherein the electronic devices are arranged on at least one support portion of the printed circuit board.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein:

FIG. 3 shows a cross-section of the module of FIG. 1, taken along section plane III of FIG. 1;

FIG. 4 shows a perspective view of the frame of the module of FIG. 1, according to an embodiment;

FIGS. 5 and 6 show respectively an internal side and an external side of the printed circuit board of the module of FIG. 1;

FIG. 10 shows a perspective view of the present module, according to a different embodiment;

FIG. 11 shows a perspective view of a frame of the module of FIG. 10;

DETAILED DESCRIPTION

Figures 1, 2:
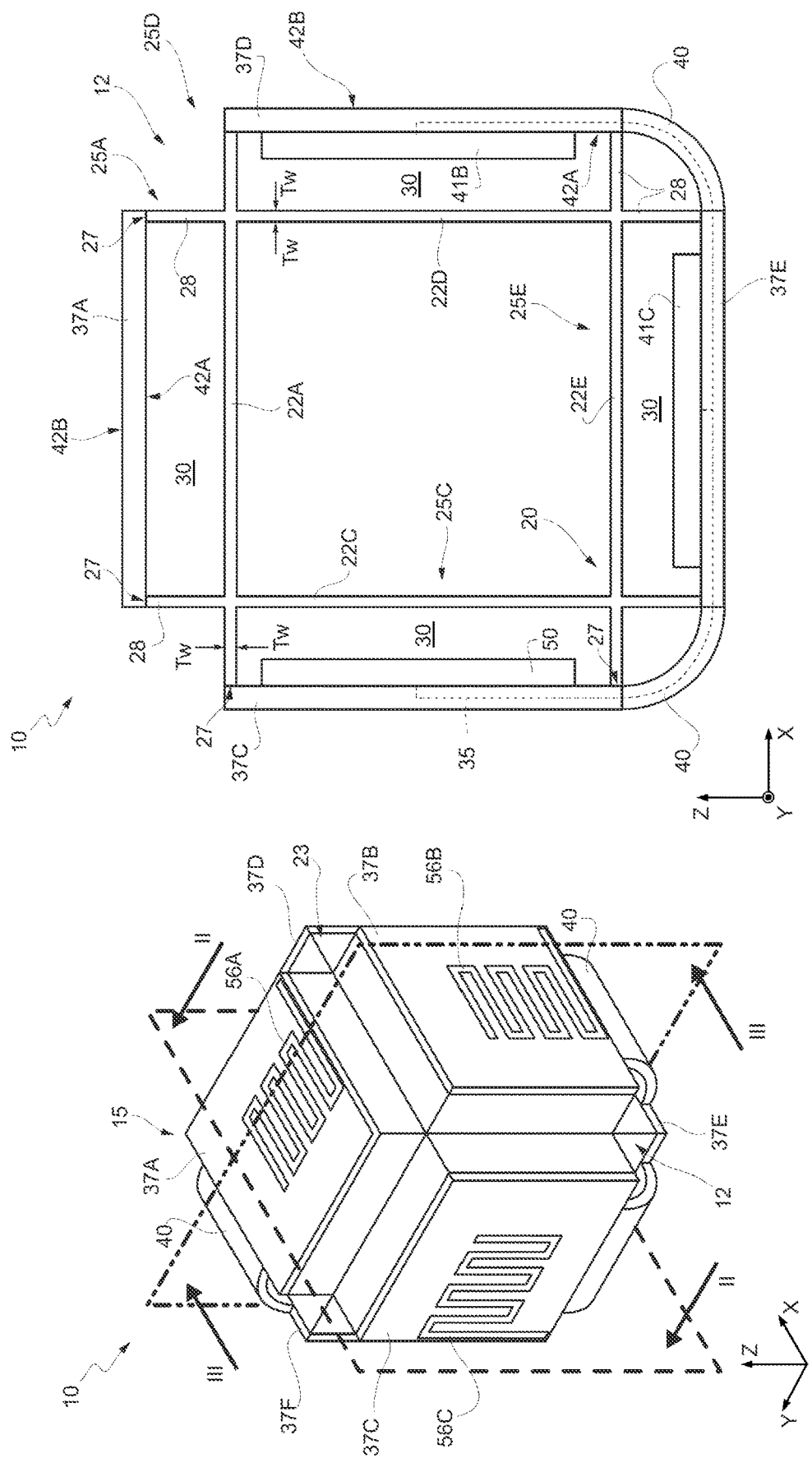
FIG. 1 shows a perspective view of the present module comprising a frame, a printed circuit board carried by the frame, and a plurality of electronic devices carried by the printed circuit board.
FIG. 2 shows a cross-section of the module of FIG. 1, taken along section plane II of FIG. 1.

FIGS. 1-3 show, in a Cartesian reference system XYZ comprising a first axis X, a second axis Y and a third axis Z, a module 10 comprising a frame 12, a printed circuit board (PCB) 15 carried by the frame 12, and a plurality of electronic devices 17, for example integrated circuits, sensors, batteries, antennas, passive elements, etc., carried by the printed circuit board 15.

The module 10 may be used as a stand-alone electronic apparatus, or may be mounted or integrated in an electronic apparatus, not shown here.

The module 10 may be used as a node of a network formed by a plurality of modules wirelessly interconnected to each other, for example the module 10 may be a System-in-a-Package (SiP), in particular an IoT ("Internet of Things") device couplable to or in communication with a network of IoT devices.

The frame 12 is of a material capable of shielding a radio frequency electromagnetic radiation, for example having frequencies comprised in the range between 800 MHz and 5.5 GHz. The fact that the frame 12 may shield an electromagnetic radiation up to 5.5 GHZ also allows to shield the harmonic distortions of order greater than one, that are relative to signals commonly used in wireless communications, for example the second harmonic distortion of the BlueTooth Low Energy (BLTE) protocol having a central frequency of 2450 MHz and an operating frequency range between 2400 MHz and 2483.5 MHz.

For instance, the frame 12 may be of a metal material such as aluminum or copper.

However, the frame 12 may be of a different material, for example of plastic or ceramic, or may be of an adhesive material, for example a B-stage material suitable for being subject to a double curing or polymerization process.

For instance, if the frame 12 is not of a metal material, the surfaces of the frame 12 may be partially or entirely metallized, so as to shield a radio frequency electromagnetic radiation, depending on the specific application.

The frame 12, shown in detail in FIG. 4, is monolithic and forms a three-dimensional support structure of the printed circuit board 15.

In other words, the frame 12 extends along the first axis X, the second axis Y and the third axis Z of lengths similar to each other, for example having a same order of magnitude. In practice, the frame 12 does not have a dimension, for example along the first axis X, which is negligible with respect to the other two dimensions, for example along the second and third axes Y, Z.

In detail, the frame 12 is formed by a skeleton structure 20 and by a housing structure 23, that are monolithic. For example, the skeleton structure 20 and the housing structure 23 may be formed by 3D printing or may be obtained by machining a single block, for example by milling, molding, etc.

However, the skeleton structure 20 and the housing structure 23 may be formed by different elements machined separately and subsequently joined to each other, for example soldered, bonded or glued.

The skeleton structure 20 is a polyhedron, for example a tetrahedron, a hexahedron, an octahedron, etc., that is regular or irregular, concave or convex, for example a prism, in particular here a cube comprising six faces 22A-22F, hereinafter also referred to as first face 22A, second face 22B, third face 22C, fourth face 22D, fifth face 22E and sixth face 22F. The frame 12 as shown in FIGS. 3 and 4 may have a closed skeleton configuration due to the presence of the six faces 22A-22F. The faces 22A-22F each have an area, in plan, comprised, for example, between 7 mm×7 mm and 10 mm×10 mm.

The skeleton structure 20 may be solid, for example to obtain a greater electromagnetic shielding effect, or may be hollow, for example to decrease the weight of the frame 12.

Alternatively, the skeleton structure 20 may be filled with a specific material, for example a resin or gel, depending on the specific application. For example, the skeleton structure 20 includes an internal cavity 26 that is surrounded by the six faces 22A-22F, and, in some embodiments, the internal cavity 26 may be filled with the specific material, for example, the resin or gel, depending on the specific application.

The housing structure 23 comprises six housing portions 25A-25F, hereinafter also referred to as first, second, third, fourth, fifth and sixth housing portions 25A, 25B, 25C, 25D, 25E and 25F, each coupled to a respective face 22A-22F of the skeleton structure 20.

The housing portions 25A-25F each have a respective fixing surface 27 for fixing the printed circuit board 15 and each form a respective housing 30 configured to house one or more of the electronic devices 17.

The housing portions 25A-25F are equal to each other; however, the housing portions 25A-25F may have shapes and/or dimensions different from each other.

In detail, the housing portions 25A-25F are each formed by a number of walls, here four walls 28, each having a thickness Tw comprised for example between 200 μm and 300 μm.

The walls 28 each extend from the respective face 22A-22F of the skeleton structure 20, towards the outside of the skeleton structure 20, for a length comprised, for example, between 1 mm and 3 mm.

The walls 28 of each housing portion 25A-25F form the respective fixing surface 27 thereof.

In this embodiment, the walls 28 of each housing portion 25A-25F are joined to each other at respective ends, so that the respective fixing surface 27 is a continuous surface.

The walls 28 of each housing portion 25A-25F form the respective housing 30 thereof.

The housings 30 are each delimited, towards the inside of the frame 12, by the respective face 22A-22F of the skeleton structure 20.

In practice, the housings 30 are each completely closed on the sides by the walls 28 of the respective housing portion 25A-25F.

Furthermore, in this embodiment, the walls 28 extend from the corners of the respective faces 22A-22F of the skeleton structure 20.

However, the walls 28 may extend from internal portions of the faces 22A-22F, so that the housings 30 each have, in plan, a smaller area than the area of the respective face 22A-22F.

In this embodiment, the walls 28 of each housing portion 25A-25F extend perpendicularly to the respective face 22A-22F.

Furthermore, the walls 28 of each housing portion 25A-25F all protrude by a same length from the respective face 22A-22F. In practice, the fixing surface 27 of each housing portion 25A-25F lies on a plane parallel to the plane of the respective face 22A-22F.

However, the housing portions 25A-25F may be different from each other in number, shape, dimension and arrangement of the respective walls 28.

The printed circuit board 15 is a flexible printed circuit board, in particular a rigid-flex or rigid-flexible printed circuit board formed by rigid portions mutually coupled, electrically and/or mechanically, by flexible portions, and is carried by the housing structure 23 of the frame 12.

One or more electrical connection lines 35 are formed in the printed circuit board 15, schematically indicated for simplicity by a dashed line in FIGS. 2 and 3.

The electrical connection lines 35 may be formed both internally and superficially to the printed circuit board 15 and are configured to connect one or more of the electronic devices 17 to each other.

In detail, in this embodiment, the printed circuit board 15 comprises six rigid portions 37A-37F, hereinafter also referred to as first, second, third, fourth, fifth and sixth rigid portions 37A, 37B, 37C, 37D, 37E and 37F, one for each housing portion 25A-25F of the housing structure 23, and five flexible portions 40 which couple the rigid portions 37A-37F to each other. As shown in FIG. 2 of the present disclosure, the electrical connection lines 35 may extend through the flexible portions 40.

The rigid portions 37A-37F of the printed circuit board 15 each have a first surface 42A, facing towards the inside of the frame 12, in particular here facing a respective face 22A-22F of the skeleton structure 20, and a second surface 42B opposite to the first surface 42A and facing towards the outside of the frame 12.

In this embodiment, the first and the second surfaces 42A, 42B of the rigid portions 37A-37F have a squared shape and have an area comprised, for example, between 7 mm×7 mm and 10 mm×10 mm, here approximately equal to the area of the faces 22A-22F of the skeleton structure 20.

As shown in FIGS. 5 and 6, wherein the printed circuit board 15 is shown separate from the frame 12, the printed circuit board 15 forms, in plan, a planar unfolding of the frame 12.

The rigid portions 37A-37F of the printed circuit board 15 are each fixed to a respective housing portion 25A-25F of the frame 12.

In detail, the first surface 42A of the rigid portions 37A-37F is bonded to the fixing surface 27 of the respective housing portion 25A-25F, for example through a specific glue or adhesive material, or through die-attach films of adhesive type.

In practice, the rigid portions 37A-37F of the printed circuit board 15 extend transversely to each other in space; thus, they have a three-dimensional, i.e., non-planar, spatial arrangement.

The electronic devices 17 are electrically coupled to the printed circuit board 15, so that all or some of the electronic devices 17 are mutually connected by the electrical connection lines 35, depending on the specific application.

In this embodiment, the electronic devices 17 are carried by the rigid portions 37A-37F of the printed circuit board 15.

For instance, some electronic devices 17 may be mounted on the rigid portions 37A-37F of the printed circuit board 15 through a surface mount technology (SMT).

However, some electronic devices 17 may be coupled to the printed circuit board 15 through different coupling technologies, for example may be bonded to the rigid portions 37A-37F and electrically connected to the electrical connection lines 35 through wire bonding.

The electronic devices 17 may also be coupled to the flexible portions 40 of the printed circuit board 15.

In addition, some electronic devices 17 may be formed directly on the printed circuit board 15.

Figure 7:
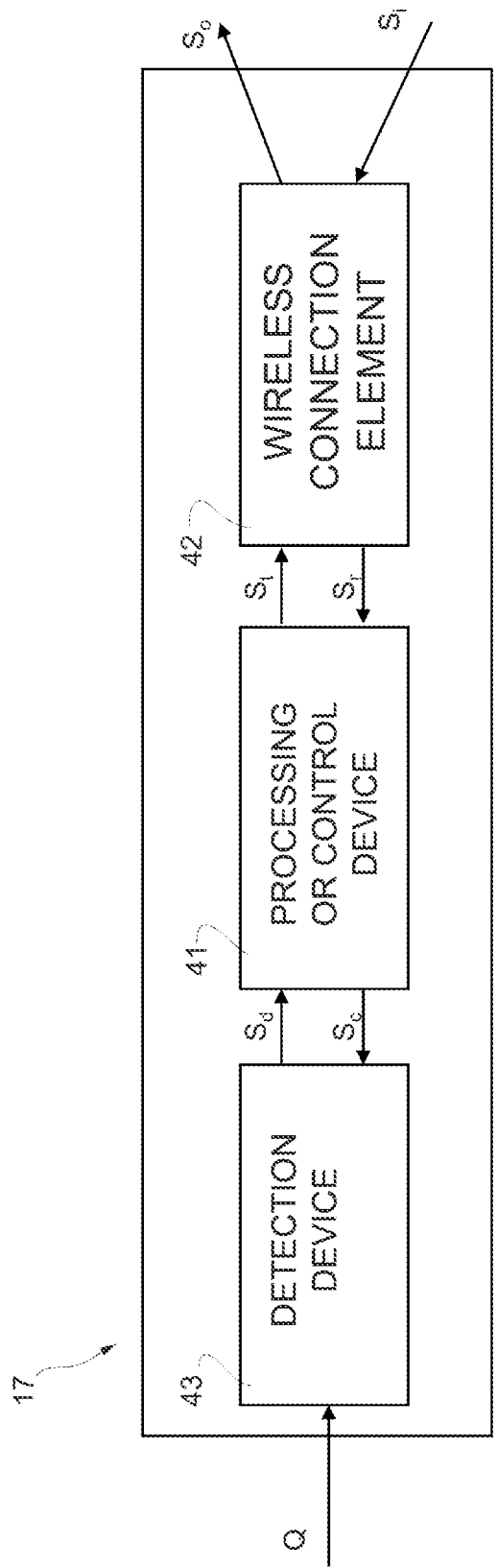
FIG. 7 shows a block diagram of the electronic devices of the present module.

With reference to FIGS. 5-7, the electronic devices 17 include at least one processing or control device 41, here three processing or control devices 41A-41C, each including a respective integrated circuit 60; and at least one wireless connection element 42, here five antennas 56A-56E, that are mutually coupled.

Furthermore, in this embodiment, the electronic devices 17 also include at least one detection device 43, here two sensors 50, configured to detect one or more physical quantities Q and coupled to the processing or control devices 41A-41C.

The antennas 56A-56E are formed directly on the printed circuit board 15 and are configured to each receive and send a respective radio frequency signal. In detail, the antennas 56A-56F are formed by metal lines formed on the second surface 42B of the first, the second, the third, the fourth and, respectively, the sixth rigid portions 37A, 37B, 37C, 37D and 37F of the printed circuit board 15.

For instance, the antennas 56A-56E may be configured to receive and send electromagnetic signals having a same frequency or different frequencies, depending on the specific application.

The module 10 may comprise a different number of antennas, depending on the emission profile desired by the module 10. For example, the module 10 may comprise six antennas, one for each rigid portion 37A-37F. Alternatively, the module 10 may comprise a smaller number of antennas.

The first, the second and the third processing or control devices 41A-41C are each formed by the respective integrated circuit 60 and by one or more oscillators 62, for example quartz oscillators, and a plurality of passive elements 64, for example inductors, resistors and capacitors.

The first, the second and the third control devices 41A-41C are mounted on the first surface 42A of the second, the fourth and, respectively, the fifth rigid portions 37B, 37D and 37E of the printed circuit board 15.

Each of the first, the second and the third control devices 41A-41C may be a microcontroller, a microprocessor, a System-on-a-Chip (SoC), etc., configured to perform a specific function, depending on the specific application.

For instance, the third processing or control device 41C may be a microcontroller configured to receive and process the data provided by the sensors 50 and provide output data to be sent externally to the module 10.

According to an embodiment, the third processing or control device 41C may also be configured to be coupled to one or more of the antennas 56A-56E, for example to control the activation thereof and send the output data.

The first and the second processing or control devices 41A, 41B may each be a radio frequency transducer operating in a respective frequency range, which is operatively coupled to the third processing or control device 41C and to one or more of the antennas 56A-56E.

The sensors 50 may be, for example, inertial sensors such as gyroscopes, accelerometers, inclinometers, electrostatic charge variation sensors, temperature sensors, pressure sensors, mechanical stress sensors, etc., in particular they are sensors made using MEMS ("Micro Electro-Mechanical Systems") technology.

The sensors 50 are mounted on the first surface 42A of the third rigid portion 37C of the printed circuit board 15; however, the sensors 50 may each be mounted on a respective rigid portion 37A-37F.

Depending on the specific application, it may be useful to mount the sensors 50 on different rigid portions of the printed circuit board, so as to modify the spatial orientation of the sensors 50.

In the module 10, the electronic devices 17 also include a physical coupling interface 58, formed on the second surface 42B of the fifth rigid portion 37E of the printed circuit board 15. The physical coupling interface 58 is here a Land Grid Array (LGA) which may be used to physically couple the third processing or control device 41C to an external electronic circuit or apparatus, not shown here.

However, the physical coupling interface 58 may be of a different type, for example of the Pin Grid Array (PGA) or Ball Grid Array (BGA) type.

Alternatively, the module 10 may be configured to be couplable with the outside only in wireless mode, for example through the antennas 56A-56E.

In use, the detection devices 43 generate one or more detection signals $S_d$ as a function of the detected physical quantities Q, for example acceleration, temperature, pressure, angular velocity, etc.

The processing or control devices 41 receive and process the detection signals $S_d$ and generate a transmission signal $S_t$ as a function of the detection signals $S_d$.

For instance, the transmission signal $S_t$ is generated upon the occurrence of specific events detectable from the detection signals $S_d$.

For instance, the processing or control devices 41 may be configured to perform machine learning algorithms, for example neural networks, etc., to determine the occurrence of certain conditions or events in the detection signal $S_d$.

For instance, the processing or control devices 41 may be configured to compare the detection signals $S_d$ with specific threshold values, determined in a calibration or initialization step of the module 10.

The antennas 56A-56E receive the transmission signal $S_t$ and generate a radio frequency electromagnetic signal, herein referred to as the output signal $S_o$.

The output signal $S_o$ may be generated by all the antennas 56A-56E or by some of the antennas 56A-56E, depending on the specific application. For example, the processing and control devices 41A-41C may control the on-off switching of the antennas 56A-56E, in order to form a desired emission pattern of the output signal $S_o$.

Furthermore, in use, the wireless connection elements 42 may receive an input signal $S_i$ coming from an electronic apparatus external to the module 10, for example from a further module similar to the module 10 when the module 10 belongs to a network of wireless modules.

The wireless connection elements 42 generate a reception signal $S_r$, in response to the reception of the input signal $S_i$.

The processing and control devices 41 receive the reception signal $S_r$ and, in response, may perform further operations, for example may generate a control signal $S_c$ and provide it to the detection devices 43 or may generate a further transmission signal $S_t$, depending on the specific application.

The presence of the antennas 56A-56E coupled to different faces of the skeleton structure 20 allows the antennas 56A-56E to mutually have different spatial orientations. As a result, the module 10 may have an emission diagram of the output signal $S_o$ which may be modified depending on the specific application, for example depending, in use, on the required directionality.

The antennas 56A-56E may have a high footprint (or area occupation) on the printed circuit board 15, for example comprised between $7 \times 7$ mm$^2$ and $10 \times 10$ mm$^2$, depending on the specific implementation of the same antennas 56A-56E.

However, the fact that both the first and the second surfaces 42A, 42B of the rigid portions 37A-37F of the printed circuit board 15 may be used to form the antennas 56A-56E and to mount the sensors 50 and the processing and control devices 41A-41C, allows the total footprint of the printed circuit board 15 to be reduced.

As a whole, therefore, the module 10 may have a low area occupation and therefore low manufacturing cost.

Furthermore, if the frame 12 is completely or partially formed by a material capable of shielding an electromagnetic radiation, it is possible to modify the desired emission diagram of the module 10, during the design step, by modifying shape and dimensions of the frame 12, in particular of the skeleton structure 20 and of the housing structure 23.

In addition, in module 10, the housings 30 form an electromagnetic shield for the detection devices 43 and the processing and control devices 41 housed therein. As a result, the detection devices 43 and the processing and control devices 41 are subject to low electromagnetic interference, thus lowering the risk that the electromagnetic interference compromises the performances or correct operation thereof.

In the module 10, the processing and control devices 41A-41C are carried on different faces of the skeleton structure 20. As a result, they face towards directions that are transverse to each other. This allows a possible electromagnetic interference between the same processing and control devices 41A-41C to be further reduced.

Therefore, as a whole, the electronic devices 17 of the module 10 are subject to a low mutual electromagnetic interference.

Figure 8:
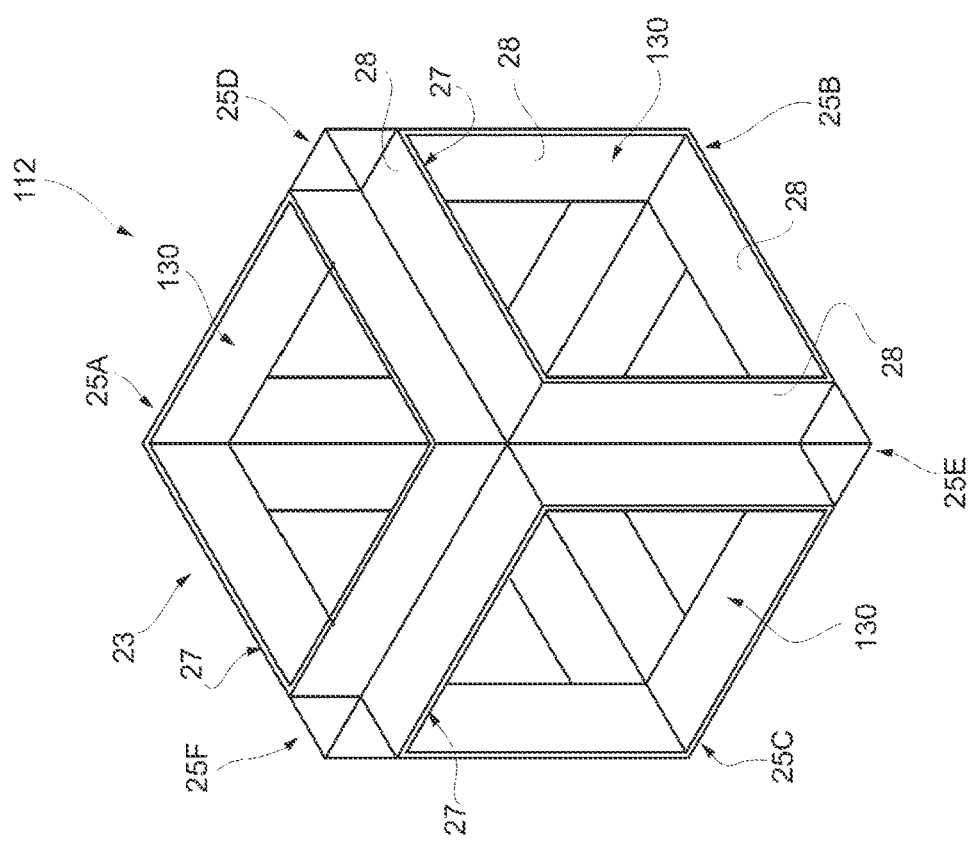

FIG. 8 shows a different embodiment of the frame, here indicated by 112, of the module 10 of FIG. 1. The frame 112 has a general structure similar to that of the frame 12 of FIG. 4; as a result, elements in common are indicated by the same reference numbers and not further described.

Figure 9:
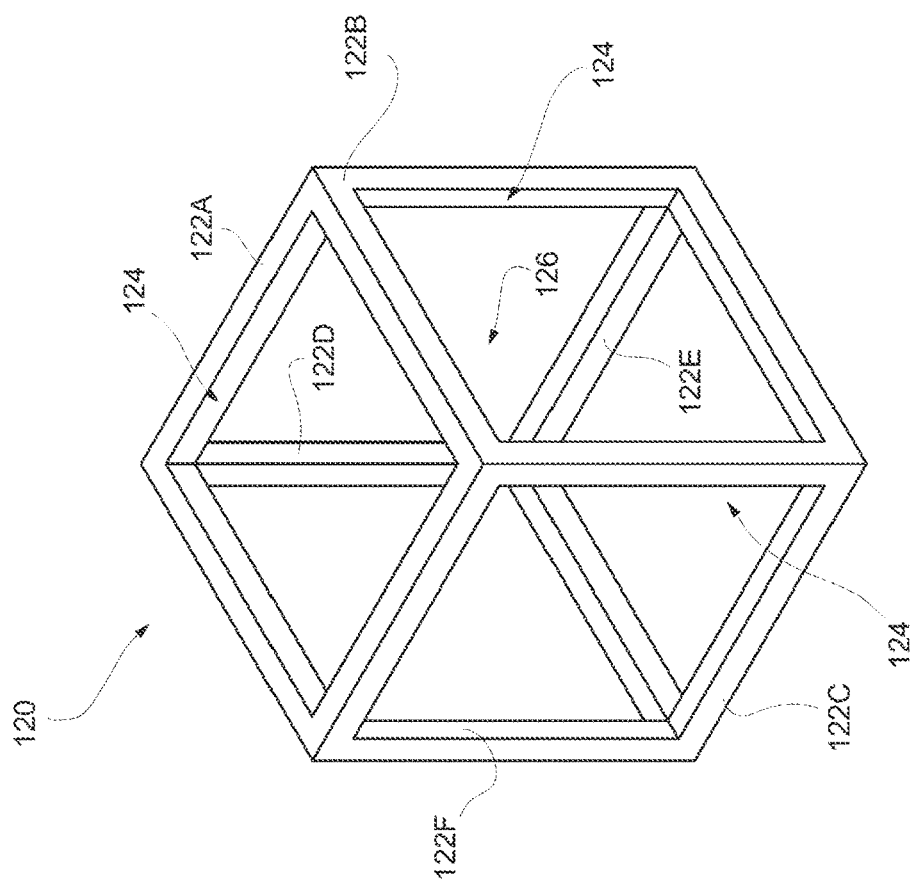
FIGS. 8 and 9 show two perspective views of a frame of the present module, according to a different embodiment.

In detail, the frame 112 may be partially or entirely, here entirely, of metal material suitable for shielding a radio frequency electromagnetic radiation, and is formed by a skeleton structure, here indicated by 120 and shown in detail in FIG. 9, and by the housing structure 23.

Also in this embodiment, the skeleton structure 120 has a polyhedral shape, in particular a cubic shape, and comprises six faces, here indicated by 122A-122F. The frame 112 may have an opened skeleton structure as the six faces 22A-22F are not present that are present in the frame 12.

The skeleton structure 120 has an internal cavity 126.

The faces 122A-122F are each crossed by a respective cavity or opening 124. In practice, the faces 122A-122F each form a frame which laterally delimits the respective cavity or opening 124. The respective cavity or openings 124 extend to the internal cavity 126.

The housing structure 23 comprises here again six housing portions 25A-25F, one for each of the faces 122A-122F. In detail, the housing portions 25A-25F are each formed by the walls 28, which extend from the respective face 122A-122F towards the outside of the skeleton structure 120 and form the housings, here indicated by 130.

In practice, in this embodiment, the housings 130 are open towards the inside of the frame 112 and each communicate with the internal cavity 126 of the skeleton structure 120.

The frame 112 may be lighter than the frame 12 of FIG. 4. For example, as the frame 112 as shown in FIG. 8 has the open skeleton configuration and the frame 12 as shown in FIG. 3 has the closed skeleton configuration, the frame 112 may be made of less material such that the frame 112 is less heavy (i.e., lighter) than the frame 12.

FIGS. 10 and 11 show a different embodiment of the present module, here indicated by 200. The module 200 has a general structure similar to that of the module 10 of FIG. 1; as a result, elements in common are indicated by the same reference numbers and not further described.

In detail, the module 200 comprises a frame, here indicated by 212; a printed circuit board, here indicated by 215, carried by the frame 212; and a plurality of electronic devices carried by the printed circuit board 215, of which only four antennas 256A-256D are shown here.

The frame 212, shown in detail in FIG. 11, may be partially or entirely, here entirely, of a material suitable for shielding a radio frequency electromagnetic radiation, for example of metal material or of other material having a metal coating.

The frame 212 comprises a skeleton structure, here indicated by 220, and a housing structure, here indicated by 223, monolithic to each other.

The skeleton structure 220 is a polyhedral structure, hollow in the inside. For example, the frame 212 as shown in FIG. 11 has the open skeleton configuration similar to that of the frame 112. However, in some alternative embodiments of the frame 212, the frame 212 may have the closed skeleton configuration similar to that of the frame 12.

In detail, the skeleton structure 220 is a prism having a first base 222A and a second base 222B, here of hexagonal type, and six lateral faces 222C-222H extending between the first base 222A and the second base 222B.

The lateral faces 222C-222H are parallelepipeds, here each having in plan a rectangular shape.

An internal cavity 231 entirely crosses the skeleton structure 220 and extends between the first base 222A and the second base 222B.

The lateral faces 222C-222H are each crossed, centrally, by a respective through-cavity 233 communicating with the internal cavity 231.

The housing structure 223 comprises six housing portions 225A-225F, each coupled to a respective lateral face 222C-222H and having a respective fixing surface 227.

The housing portions 225A-225F are formed, here again, each by four walls 228 extending from the respective lateral face 222C-222H, towards the outside of the skeleton structure 220, thus forming a respective housing 230. Each one of the housing portions 225A-225F is present along a corresponding lateral face of the lateral faces 222C-222H.

In this embodiment, the housings 230 are each contiguous with the respective through-cavity 233 and therefore communicate with the internal cavity 231.

Furthermore, the housings 230 have, in plan, a rectangular shape and have a smaller area than the respective lateral face 222C-222H.

Also in this embodiment, the bonding surfaces 227 are parallel to the respective lateral faces 222C-222H. However, the walls 228 may be separated from each other, so that each fixing surface 227 is formed by portions that are discontinuous to each other. Additionally or alternatively, the fixing surfaces 227 may be transverse with respect to the respective lateral faces 222C-222H.

The printed circuit board 215 is, here again, of rigid-flex type, and is formed by eight rigid portions 237A-237H, hereinafter also referred to as first, second, third, fourth, fifth, sixth, seventh and eighth rigid portions 237A-237H, mutually coupled electrically and mechanically by flexible portions 240, shown here only partially. For example, the electrical connection lines similar to the electrical connection lines 35 may extend through respective flexible portions of the plurality of flexible portions 240.

The rigid portions 237A-237H each have a respective first surface, not shown here, which is coupled to the frame 212 and faces towards the inside of the frame 212, and a respective second surface 242B which is opposite to the first surface and faces towards the outside of the frame 212.

In detail, the first and the second rigid portions 237A, 237B have, in plan, a hexagonal shape and are coupled to the first and, respectively, to the second base 222A, 222B of the skeleton structure 220, for example bonded or differently fixed.

The rigid portions from the third to the eighth rigid portions 237C-237H have in plan a rectangular shape and are each coupled to a respective housing portion 225A-225F. In detail, the rigid portions 237C-237H are fixed, for example bonded, soldered or differently fixed, to the fixing surface 227 of the respective housing portion 225A-225F.

In this embodiment, the first surface 242A of the rigid portions from the third to the eighth rigid portions 237C-237H have a larger area, in plan, than the respective housing 230. In practice, the rigid portions 237C-237H of the printed circuit board 215 each protrude laterally from the respective housing portion 225A-225F.

However, the shape and dimension of the rigid portions 237A-237H may be different from what has been shown, depending on the specific application.

The module 200 may comprise here again, as shown in FIG. 7 for the module 10, the processing and control devices 41, the external connection elements 42, and the detection devices 43, equal to or different from what has been shown for the module 10, depending on the specific application of the module 200.

The detection devices 43 and the processing and control devices 41, not shown for clarity in FIG. 10, are mounted here again on the first surface of one or more of the rigid portions 237A-237H, so as to be arranged in the housings 230 or in the internal cavity 231.

In practice, in this embodiment, the internal cavity 231 forms a housing of the processing and control devices 41 and the detection devices 43.

The module 200 comprises a plurality of antennas, for example one for each rigid portion 237A-237H of the printed circuit board 215, and of which only four antennas 256A-256D are shown in FIG. 10.

The antennas 256A-256D are formed on the second surface 242B of the first, the third, the fourth and, respectively, the eighth rigid portions 237A, 237C, 237D and 237H of the printed circuit board 215.

The module 200 has a number of rigid portions 237A-237H that is greater than the number of rigid portions 37A-37F of the module 10 of FIG. 1; as a result, the module 200 may comprise a number of electronic devices, for example sensors, integrated circuits, antennas, that is greater than the module 10.

As a result, if for example the module 200 comprises an antenna for each rigid portion 237A-237H of the printed circuit board 215, the module 10 may have greater versatility, for example in modifying the electromagnetic emission diagram of the module 200, with respect to the module 10 of FIG. 1.

Figure 13:
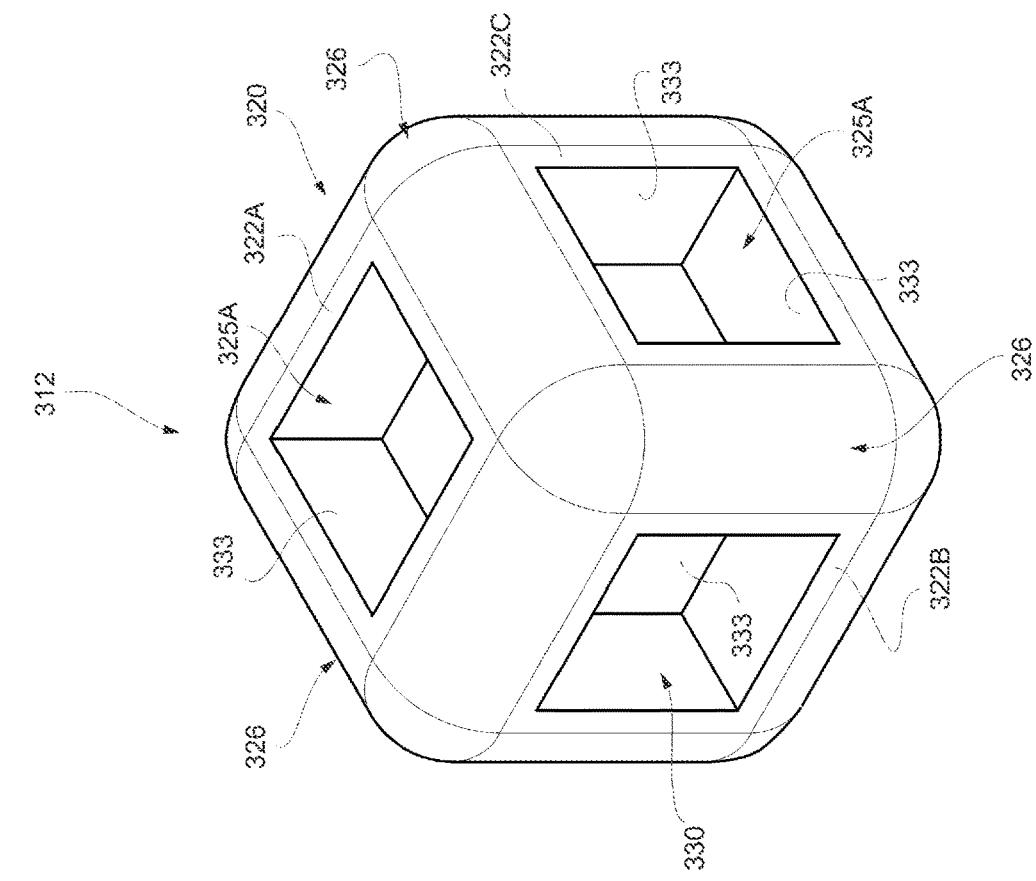
FIG. 13 shows a perspective view of a frame of the module of FIG. 12.
Figure 12:
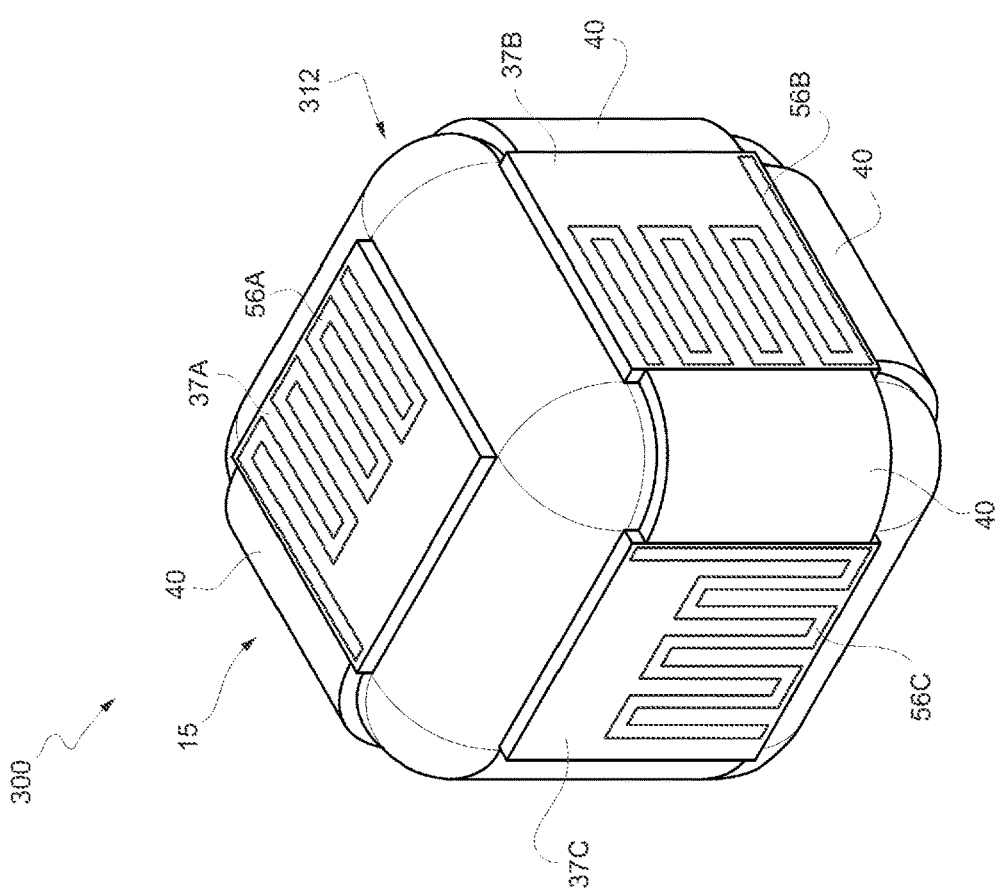
FIG. 12 shows a perspective view of the present module, according to a different embodiment.

FIGS. 12 and 13 show a different embodiment of the present module, here indicated by 300. The module 300 has a general structure similar to that of the module 10 of FIG. 1; as a result, elements in common are indicated by the same reference numbers and not further described.

In detail, the module 300 comprises a frame, here indicated by 312; the printed circuit board 15 carried by the frame 312; and a plurality of electronic devices, for example as described with reference to FIG. 7, carried by the printed circuit board 15 and of which only three antennas 56A-56C are shown here.

The frame 312, shown in detail in FIG. 13, may be here again of metal, plastic, or adhesive material, and be partially or entirely of a material suitable for shielding a radio frequency electromagnetic radiation, similarly to what has been described for the frame 12 of the module 10.

The frame 312 comprises a plurality of housings 330 and is formed by a skeleton structure, here indicated by 320, and a housing structure, here indicated by 323, and formed in the skeleton structure 320.

The skeleton structure 320 is a polyhedron, in particular a hexahedron, here a cube, having six faces, of which only three faces 322A-322C are shown in FIG. 13.

In this embodiment, the faces of the skeleton structure 320 are joined to each other by curved portions 326. In practice, the curved portions 326 form rounded corners of the skeleton structure 320.

In FIGS. 12 and 13, the curved portions 326 are identified, for clarity, by solid-drawn lines, in order to show the curvature thereof.

The housing structure 323 comprises six housing portions, one for each face of the skeleton structure 320, of which only three housing portions 325A-325C are shown in FIG. 13.

The housing portions 325A-325C each extend from a respective face 322A-322C, towards the inside of the skeleton structure 320 and form the housings 330.

In detail, the housings 330 are internal to the skeleton structure 320 and are delimited by internal walls 333 of the skeleton structure 320. The frame 312 has the closed skeleton configuration similar to that of the frame 12 due to the presence of the internal walls 333. However, in some alternative embodiments, the internal walls 333 may not be present such that the frame 312 may have the open skeleton configuration similar to the frame 112.

In this embodiment, the printed circuit board 15 is carried directly by the skeleton structure 320.

In detail, the rigid portions 37A-37F, of which only three rigid portions 37A-37C are shown, are fixed, for example bonded, each to a respective face of the skeleton structure 320.

In practice, the electronic devices (not shown here) which are mounted on the first surface 42A of each of the rigid portions 37A-37F are arranged in the housings 330.

Finally, it is clear that modifications and variations may be made to the modules 10, 200, 300 described and illustrated herein without thereby departing from the scope of the present disclosure, as defined in the attached claims.

The shape and dimensions of the frame, in particular of the skeleton structure and of the housing structure, may vary. For example, the skeleton structure may form a polyhedral structure different from those shown. Furthermore, the skeleton structure may have a non-polyhedral shape, for example a cylindrical shape.

Furthermore, the faces of the skeleton structure may be equal to or different from each other, depending on the specific application.

Figure 14:
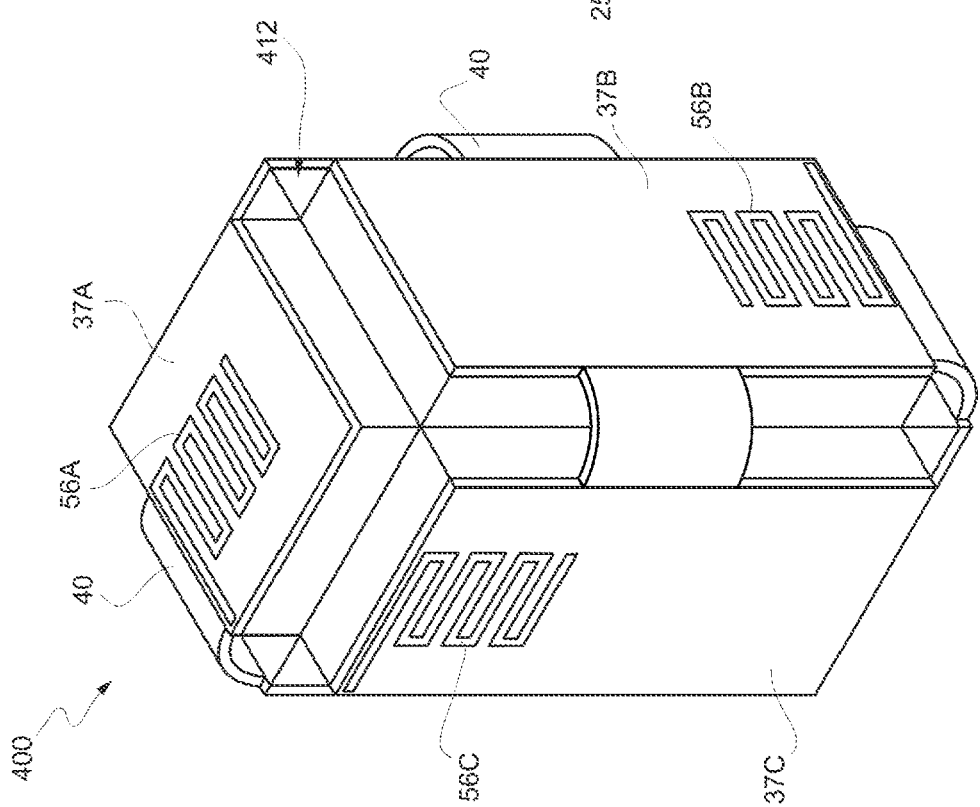
FIG. 14 shows a perspective view of the present module, according to a further embodiment.

For instance, as shown in FIG. 14, the present module, here indicated by 400, may have a frame 412 forming a prism having squared bases 413 and rectangular lateral faces 414. In some embodiments, the frame 412 may have the closed skeleton configuration, and, in some alternative embodiments, the frame 412 may have the open skeleton configuration.

Furthermore, the rigid portions of the printed circuit board may have in plan a different shape with respect to that of the respective faces of the skeleton structure to which they are coupled.

Furthermore, the present module may have a number of rigid portions that is lower than the number of faces of the respective skeleton structure, depending on the specific application.

Figure 15:
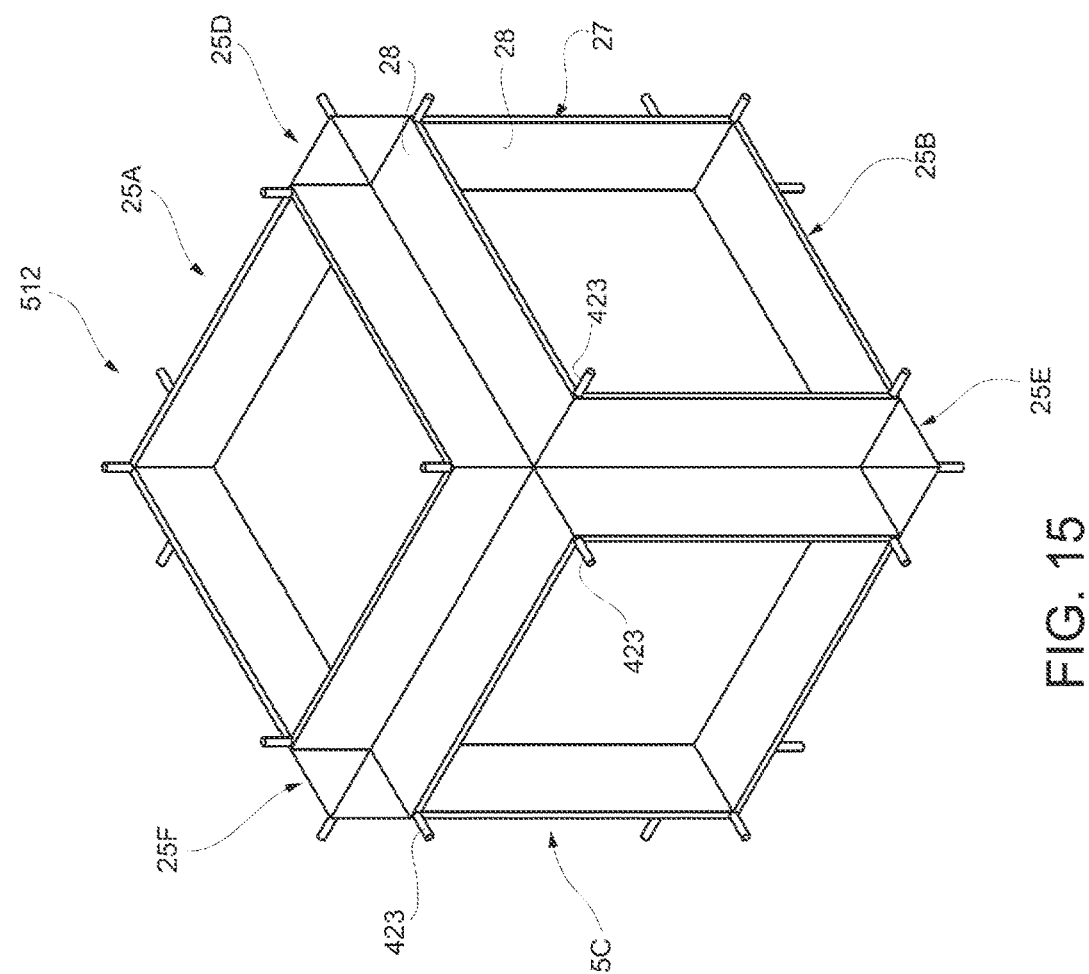
FIG. 15 shows a frame of the present module, according to a different embodiment.

Furthermore, the rigid portions of the printed circuit board may be fixed to the frame in a different manner. For example, FIG. 15 shows the frame, here indicated by 512, of the module 10 of FIG. 1, wherein the housing portions 25A-25F each comprise a plurality of pins, in particular each comprises four pins 423. In some embodiments, the frame 512 may have the closed skeleton configuration, and, in some alternative embodiments, the frame 512 may have the open skeleton configuration.

The pins 423 extend here from the fixing surface 27 of the respective housing portions 25A-25F, towards the outside of the frame 512.

The pins 423 are adapted to be housed inside respective holes formed in the rigid portions 37A-37F of the printed circuit board 15 (not shown here).

For instance, the rigid portions 37A-37F of the printed circuit board 15 may be fixed to the frame 512 only through the pins 423, without being bonded thereto. Alternatively, the rigid portions 27A-37F of the printed circuit board 15 may also be bonded to the fixing surface 27; in this case, the pins 423 may be used to increase the stability of the coupling between the rigid portions 27A-37F of the printed circuit board 15 and the frame 512.

The present module may comprise further electronic devices mounted on the printed circuit board, for example a battery for powering all the devices of the same module. In this case, one or more of the antennas may be configured to allow for wireless battery charging.

The printed circuit board may have superficial portions, facing towards the outside of the frame and coupled to a reference voltage, for example to ground. One or more metal covers may be coupled to the superficial portions, each arranged so as to overlay one or more electronic devices. Such metal covers may shield the respective electronic devices from high frequency radiations or disturbances generated by the signals of close electronic devices, arranged externally to the metal covers. For example, the metal covers may be fixed to the superficial portions of the printed circuit board by soldering or other assembly techniques.

In addition, considering by way of example the module 10 of FIG. 1, the processing and control devices 41 and/or the detection devices 43 may also be mounted on the second surface 42B of the rigid portions 37A-37F, i.e., facing towards the outside of the module 10, depending on the specific application.

Finally, the embodiments described and shown above may be combined to form further solutions.

An electronic module (10; 200; 300; 400) may be summarized as including a three-dimensional frame (12; 112; 212; 312; 412; 512); a printed circuit board (15; 215) fixed to the three-dimensional frame and including a plurality of support portions (37A-37F; 237A-237H) extending transversely to each other in space; and a plurality of electronic devices (17, 43, 41, 42) fixed to the printed circuit board and operatively coupled to each other, wherein the electronic devices are arranged on at least one support portion of the printed circuit board.

Each support portion (37A-37F; 237A-237H) of the printed circuit board may have a first surface (42A) facing towards the inside of the three-dimensional frame and a second surface (42B; 242B) facing towards the outside of the three-dimensional frame, wherein the electronic devices include an integrated circuit (60) and an antenna (56A-56E), the integrated circuit being arranged on the first surface of a respective support portion of the printed circuit board, the antenna being arranged on the second surface of a respective support portion of the printed circuit board.

The three-dimensional frame may include a skeleton structure (20; 120; 220; 320) formed by a plurality of faces (22A-22F; 122A-122F; 222A-222H) joined to each other, wherein each face is transverse to an adjacent face, the support portions (37A-37F; 237A-237H) of the printed circuit board each being carried by a respective face of the skeleton structure.

The three-dimensional frame may include a plurality of housing portions (25A-25F; 222A, 222B; 225A-225F; 325A-325F) each coupled to a respective face of the skeleton structure and forming a respective housing (30; 130; 230, 231; 333), the support portions of the printed circuit board each being fixed to a respective housing portion, the first surface of the device support portions each facing the respective housing.

At least one of the housing portions (25A-25F; 225A-225F) may include at least one wall (28; 228) extending from the respective face of the skeleton structure and forming the housing.

At least one housing portion (25A-25F; 225A-225F) may extend towards the outside of the skeleton structure.

At least one housing portion (325A-325F) may extend internally to the skeleton structure (320).

At least one of the housings (30) may be closed, towards the inside of the frame (12), by the respective face (22A-22F) of the skeleton structure (20).

The skeleton structure may have an internal cavity (126; 231), at least one of the housings (130; 230) being coupled to a face (122A-122F; 222A-222H) of the skeleton structure having a cavity (124; 233), so that the housing communicates with the internal cavity through the cavity of the face.

The skeleton structure generally may have the shape of a cube, parallelepiped, hexagonal-based prism or cylinder.

The printed circuit board (15; 215) may be a rigid-flexible printed circuit board.

The support portions (37A-37F; 237A-237H) of the printed circuit board may be rigid portions of the rigid-flexible printed circuit board, the rigid-flexible printed circuit board may further include flexible portions (40; 240) which couple, electrically and mechanically, the rigid portions to each other.

The three-dimensional frame may include a metal material configured to shield a radio frequency electromagnetic radiation.

The three-dimensional frame may have a plurality of fixing surfaces (27; 222A, 222B, 227; 322A-322F), one for each support portion of the printed circuit board, the first surface (42A) of each support portion of the printed circuit board being fixed to a respective fixing surface.

A three-dimensional frame may be usable in the electronic module.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a three-dimensional frame;
a printed circuit board coupled to the three-dimensional frame and comprising a plurality of support portions extending transversely to each other in space, each of the support portions of the printed circuit board has a first surface facing towards an inside of the three-dimensional frame and a second surface facing towards an outside of the three-dimensional frame; and
a plurality of electronic devices coupled to the printed circuit board and operatively coupled to each other, wherein the electronic devices are arranged on at least one support portion of the printed circuit board, the electronic devices including a plurality of integrated circuits and a plurality of antennas, a first integrated circuit of the plurality of integrated circuits being arranged on the first surface of a first respective support portion of the plurality of support portions, a first antenna of the plurality of antennas being arranged on the second surface of the first respective support portion of the plurality of support portions.

2. The device according to claim 1, comprising:
a second integrated circuit of the plurality of integrated circuits being arranged on the first surface of a second respective support portion of the plurality of supports portions of the printed circuit board, a second antenna of the plurality of antennas being arranged on the second surface of the second respective support portion of the plurality of support portions of the printed circuit board.

3. The device according to claim 1, wherein:
the three-dimensional frame includes a skeleton structure formed by a plurality of faces joined to each other, and each respective face of the plurality of faces is transverse to an adjacent respective face of the plurality of faces; and
each of the support portions of the printed circuit board overlaps a respective face of the plurality of faces of the skeleton structure.

4. The device according to claim 3, wherein:
the three-dimensional frame includes a plurality of housing portions-, each of the plurality of housing portions is at a respective face of the plurality of faces of the skeleton structure, and each of the housing portions defines a respective housing of a plurality of housings; and
each of the support portions of the printed circuit board is coupled to a respective housing portion of the plurality of housing portions, and each of the first surfaces of the support portions faces the respective housing of the plurality of housings.

5. The device according to claim 4, wherein at least one of the housing portions comprises at least one wall extending from the respective face of the skeleton structure and forming the housing.

6. The device according to claim 4, wherein at least one housing portion of the plurality of housing portions extends towards the outside of the skeleton structure.

7. The device according to claim 4, wherein at least one housing portion extends internally to the skeleton structure.

8. The device according to claim 4, wherein at least one of the housings is closed, towards the inside of the frame, by the printed circuit board.

9. The device according to claim 4, wherein the skeleton structure has an internal cavity.

10. The device according to claim 3, wherein the skeleton structure generally has the shape selected from one of a cube, parallelepiped, hexagonal-based prism or cylinder.

11. The device according to claim 1, wherein the printed circuit board is a rigid-flexible printed circuit board.

12. The device according to claim 11, wherein the support portions of the printed circuit board are rigid portions of the rigid-flexible printed circuit board, the rigid-flexible printed circuit board further comprises flexible portions which couple, electrically and mechanically, the rigid portions to each other.

13. The device according to claim 1, wherein the three-dimensional frame comprises a metal material configured to shield a radio frequency electromagnetic radiation.

14. The device according to claim 1, wherein the three-dimensional frame has a plurality of fixing surfaces, one for each support portion of the printed circuit board, the first surface of each support portion of the printed circuit board being fixed to a respective fixing surface.

15. A device, comprising:
a three-dimensional frame including:
a plurality of walls that are transverse to each other;
a plurality of housing portions defined by the plurality of walls, at least one housing portion extending toward an outside of the plurality of walls;
a plurality of openings that extend through the plurality of housing portions; and
an internal cavity in fluid communication with the plurality of openings extending through the plurality of housing portions; and
a printed circuit board including:
a plurality of rigid support portions, each one of the plurality of rigid support portions is coupled to respective walls of the plurality of walls;
a plurality of flexible portions that couple together the plurality of rigid support portions, each respective flexible portion of the plurality of flexible portions extends between at least a pair of the plurality of rigid support portions; and
a first electronic component is coupled to a first surface of a first respective support portion of the plurality of support portions and is within a first respective housing of the plurality of housings.

16. The device of claim 15, further comprising an antenna at a second surface of the first respective support portion opposite to the first surface of the first respective support portion.

17. The device of claim 15, further comprising a second electronic component coupled to a first surface of a second respective support portion of the plurality of support portions and within a second respective housing the plurality of housings.

18. A device, comprising:
a three-dimensional frame including:
a plurality of curved portions; and
a plurality of openings that extend into the three-dimensional frame and are defined by the plurality of curved portions; and
a printed circuit board including:
a plurality of rigid support portions in the plurality of openings; and
a plurality of flexible portions couple together at least a pair of respective rigid support portions of the plurality of rigid support portions, the plurality of flexible portions of the printed circuit board overlapping and extending over the plurality of curved portions of the three-dimensional frame; and
an electronic component is on at least a first surface of a first respective support portion of the plurality of support portions and is within a first respective opening of the plurality of openings.

19. The device of claim 18, wherein the plurality of flexible portions include a plurality of electrical connections that extend through the plurality of flexible portions.

20. The device of claim 18, wherein the three-dimensional frame includes a skeleton structure including a plurality of faces coupled to each other and transverse to each other, each support portion of the printed circuit board overlapping a respective face of the plurality of faces.

* * * * *